(12) United States Patent
Cao et al.

(10) Patent No.: US 7,211,449 B2
(45) Date of Patent: May 1, 2007

(54) ENHANCED UNIQUENESS FOR PATTERN RECOGNITION

(75) Inventors: Gary Cao, Santa Clara, CA (US); Alan Wong, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 582 days.

(21) Appl. No.: 10/697,825

(22) Filed: Oct. 29, 2003

(65) Prior Publication Data
US 2004/0086169 A1    May 6, 2004

Related U.S. Application Data

(62) Division of application No. 09/752,359, filed on Dec. 30, 2000.

(51) Int. Cl.
*H01L 21/66* (2006.01)

(52) U.S. Cl. .................................................. 438/14

(58) Field of Classification Search ............. 438/14
See application file for complete search history.

(56) References Cited

U.S. PATENT DOCUMENTS

| | | | |
|---|---|---|---|
| 5,715,385 A * | 2/1998 | Stearns et al. .............. 345/648 |
| 6,317,991 B1 | 11/2001 | Rinn |
| 6,452,677 B1 | 9/2002 | Do et al. |
| 6,509,750 B1 | 1/2003 | Talbot et al. |
| 6,528,818 B1 * | 3/2003 | Satya et al. ................... 257/48 |
| 6,539,106 B1 | 3/2003 | Gallarda et al. |
| 6,559,662 B1 | 5/2003 | Yamada et al. |
| 6,566,897 B2 | 5/2003 | Lo et al. |

* cited by examiner

*Primary Examiner*—Long Pham
(74) *Attorney, Agent, or Firm*—George Chen

(57) ABSTRACT

The present invention describes a test structure with a first set of features which is a subset of product features; and a second set of features adjacent to the first set of features, the second set occupying a smaller area than the first set and the second set being similar to the first set yet being distinguishable from surrounding structures.

8 Claims, 6 Drawing Sheets

ENHANCED UNIQUENESS FOR PATTERN RECOGNITION

This is a Divisional Application of Ser. No. 09/752,359, filed Dec. 30, 2000, which is presently pending.

BACKGROUND OF THE INVENTION

1. Field of the Invention

The present invention relates to the field of semiconductor integrated circuit (IC) manufacturing, and more specifically, to a method of improving pattern recognition for critical dimension (CD) measurement in an optical microscope or a Scanning Electron Microscope (SEM).

2. Discussion of Related Art

During fabrication of an integrated circuit (IC), many parameters of the semiconductor devices must be monitored to maximize yield. In particular, it is desirable to measure critical dimension (CD) of certain features, especially on the critical layers such as shallow trench isolation, polysilicon gate, contact, and first metal.

The CD for a layer may be monitored in-line by sampling the product features on various die across a wafer. However, it is often advantageous to measure test structures that may be placed in the scribelines separating the die. CD measurements are usually performed after develop since rework is still possible at that point by stripping the photoresist. CD measurements are also done after etch to determine the etch bias.

CD measurements are often taken optically on a tool with conventional microscope optics or with laser-spot scanning. The resolution of an optical probe can be increased by about 30% if a confocal configuration is used. However, it is usually necessary to use a scanning electron microscope (SEM) to measure a CD smaller than about 200 nanometers. To avoid charging of the sample, the acceleration voltage should be kept below about 600 to 1000 volts or the vacuum should be kept low. Field emission guns are often used to produce good images.

A SEM may be used to measure the CD of a structure after develop or after etch. After loading a wafer into the SEM, a motorized stage moves the wafer to a specified location based on an external coordinate system. Then, pattern recognition of the captured image is performed to locate the desired structure in the vicinity. Finally, the CD of the structure is measured.

Although sophisticated algorithms are available for pattern recognition, various parameters in the recipe must still be empirically optimized to improve the robustness of the recipe. If the acceptance level is too relaxed, pattern recognition may mistakenly identify an incorrect feature. Then the corresponding CD measurement would not be meaningful, thus, degrading data integrity and compromising in-line process control. On the other hand, if the acceptance level is too stringent, the pattern recognition may fail, thus, mandating manual intervention by the user. At a minimum, the processing of the wafer is interrupted. Of even more concern is that the feedback from the SEM to the process tools is delayed, needlessly leading to production of more wafers that are out of specification and have to be scrapped.

Thus, what is needed is a structure for and a method of improving pattern recognition.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a structure for and a method of improving pattern recognition for a tool, such as an optical microscope or a scanning electron microscope (SEM). The structure includes a first set of features sufficiently resembling certain product features to allow monitoring of important parameters, such as a critical dimension (CD) of a feature or a thickness of a film layer, for compliance with specification. The structure further includes a second set of features sufficiently unique compared with nearby structures to allow distinguishing them. The method includes a procedure to design such a structure and a procedure to perform pattern recognition on such a structure.

In a SEM, an electron beam is raster scanned on a sample, such as a wafer or a photomask, and the secondary electron signal is detected with a detector, such as a scintillator and a photomultiplier, or a multi-channel plate. The sample is usually scanned multiple times to produce an image of the field of view (FOV) to be stored in a buffer. Digital image processing is performed on the acquired image to identify the correct structure in the field of view.

Figure 1A:
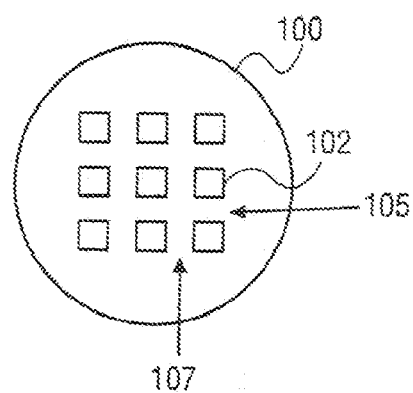
FIG. 1(a) is an illustration of a plane view of chips separated by scribelines on a wafer.

An integrated circuit (IC) is typically fabricated as a chip on a semiconductor wafer 100, as shown in FIG. 1(a). One or more chips are arranged within a die 102 that is replicated by photolithography in a regular pattern many times across the wafer 100. The die 102 are separated by horizontal scribelines 105 and vertical scribelines 107 along which they are subsequently scribed and diced to be packaged.

However, wafers often become distorted by thermal cycling during fabrication. Layer-to-layer overlay errors may also accumulate. Consequently, a desired structure may not be found initially when a stage holding a wafer sample in a SEM has been moved to a specified location. Then, it becomes necessary to search other candidate structures in the surrounding area to find the desired structure.

Pattern recognition is used to compare a candidate structure with a reference structure stored in memory. A score is calculated based on normalized correlation. All candidate structures having scores exceeding a preset threshold value are ranked. The candidate structure having the highest score is identified as the desired structure. However, an incorrect structure may still be selected, especially if the sample is not loaded properly on the stage or the stage is not calibrated precisely.

Figure 1B:
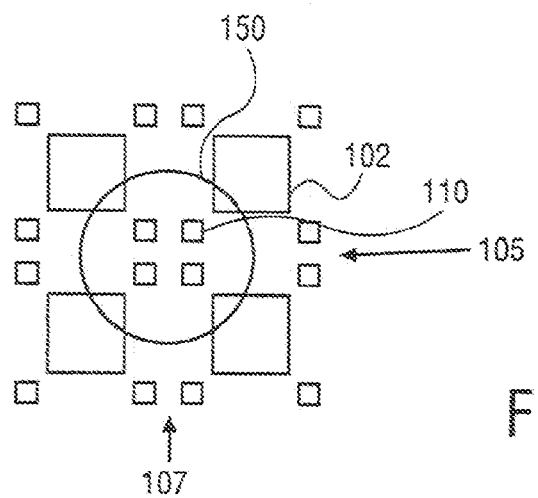
FIG. 1(b) is an illustration of a plane view of 4 adjacent chips, each chip having a metrology cell located in each corner.
Figure 1C:
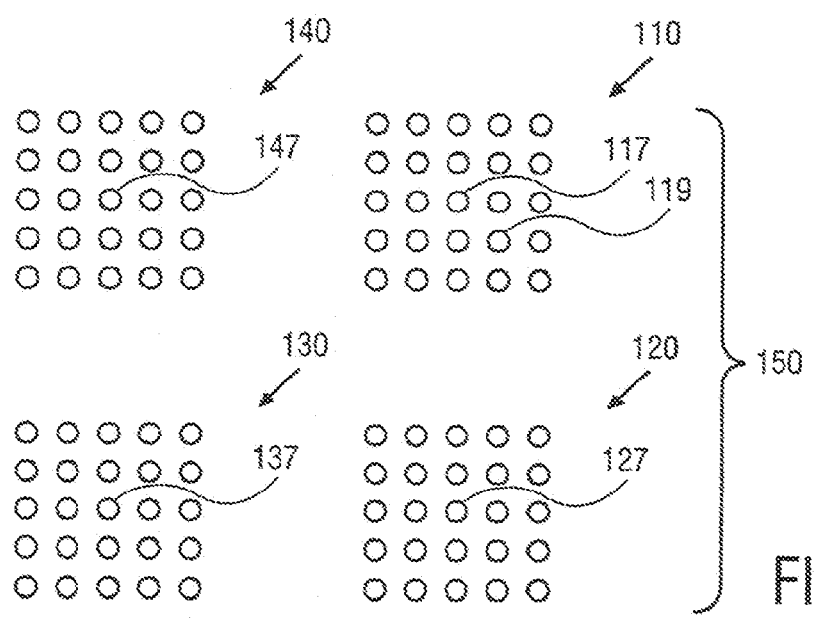
FIG. 1(c) is an illustration of a plane view of a cluster of 4 identical metrology cells at an intersection of a horizontal scribeline and a vertical scribeline.

At a particular layer of processing a wafer, it may be desired to measure a feature 117 in a test structure 110 that is representative of the product in the chip, as shown in FIG. 1(c). Feature 117 is shown as a hole that is approximately circular. In other cases, the feature 117 may have a different geometry, such as a polygon, a line, or a space. The feature 117 may have symmetry along 2 axes, 1 axis, or none at all.

A test structure 110 is usually placed near each corner of a die 102 in the scribeline, as shown in FIG. 1(b). As a result, four copies of the test structure will be located near each other in a cluster at the intersection of a horizontal scribeline 105 and a vertical scribeline 107. FIG. 1(c) shows test structures 110, 120, 130, and 140 that are located in a cluster 150.

However, instead of measuring test structure 110, a SEM may mistakenly select test structure 120 or 130 or 140, all of which can be found in the vicinity in the same cluster 150. As a result, instead of measuring the center feature 117, the SEM may measure the center feature 127 or 137 or 147. Thus, the SEM has found the wrong test structure in the cluster 150 at the intersection of 4 chips.

Figure 1D:
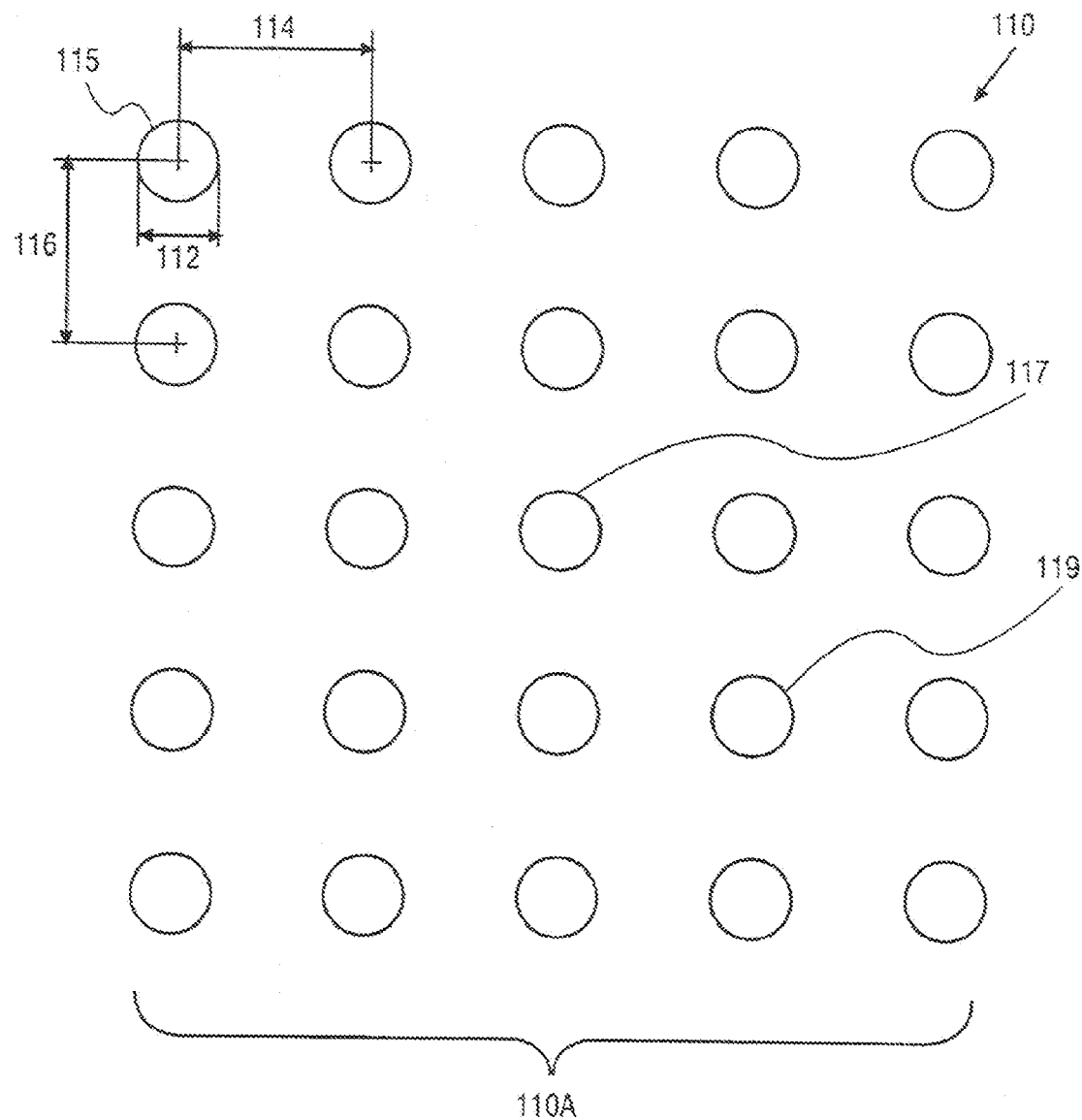
FIG. 1(d) is an illustration of a plane view of a test structure having a single array.

The CD 112 of a feature 115, as shown in FIG. 1(d), may vary, depending on the number of nearby features, their proximity, their shapes, and their CDs. A proximity effect will result from a variation in light intensity caused by a local difference in pattern density. In order to accommodate the proximity effect, it is desirable to surround the feature to be measured with a sufficient number of identical features. For example, a test structure 110 being monitored at a contact layer may have holes arranged in a 5-by-5 array 110a with a pitch 114 in the horizontal direction and a pitch 115 in the vertical direction. The pitch is defined as the center-to-center spacing of adjacent features in an array of repeating, identical features. Then CD 112 would be measured on the center feature 117 of the array.

Even if the correct test structure 110 in the cluster 150 were to be selected, the SEM may mistakenly measure the wrong feature. For example, instead of measuring the center feature 117 in the correct test structure 110, the SEM may select feature 119 that is nearby. See FIG. 1(c). Thus, the SEM has found the wrong feature 119 within the correct test structure 110 in the cluster 150.

Figure 2:
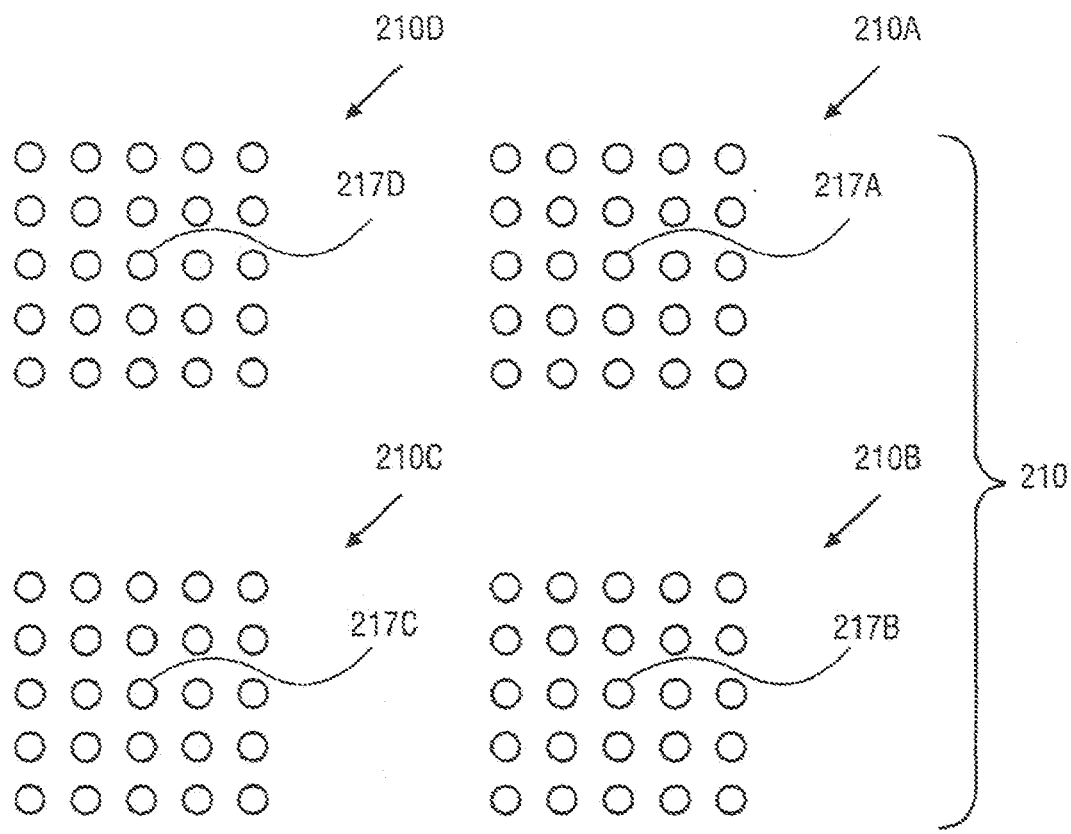
FIG. 2 is an illustration of a plane view of a test structure having multiple arrays.
Figure 3:
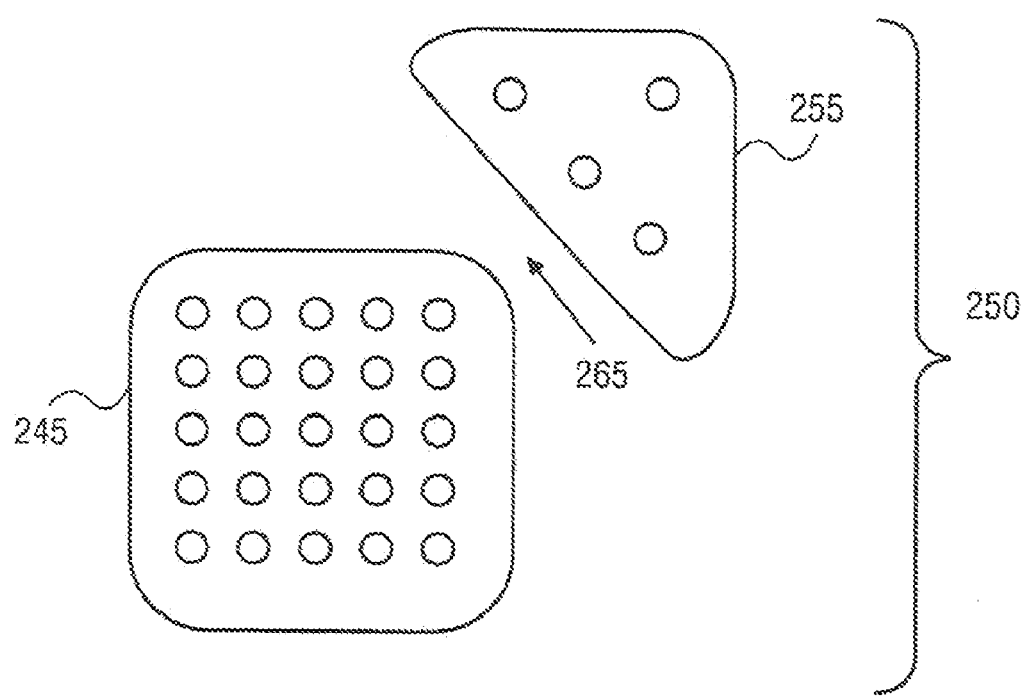
FIG. 3 is an illustration of a plane view of a test structure having a first set of features and a second set of features.

A test structure 110 may include only one array 110a, as shown in FIG. 1(d). However, a test structure 210 may also include multiple arrays 210a, 210b, 210c, 210d, as shown in FIG. 2. In the latter case, each array in the test structure 210 may be designated for use on a separate layer during the processing of the wafer.

Alternatively, the multiple arrays in the test structure 210 can be used on the same layer. Then process latitude may be characterized by studying the effect on CD of focus and exposure dose across a field and across a wafer. For example, a first array 210a may have holes with the same CD and the same pitch as the product. A second array 210b may have holes with smaller CD and the same pitch as the product. A third array 210c may have holes with larger CD and the same pitch as the product. A fourth array 210d may have the reverse polarity, in other words, islands instead of holes, with the same CD and the same pitch as the product.

For a test structure 210 that includes several similar arrays, as shown in FIG. 2, the SEM may mistakenly measure center feature 217b or 217c or 217d instead of the correct 217a. Thus, the SEM has found the wrong array within the correct test structure 210.

The present invention adds sufficient uniqueness to the desired test structure 250 so that pattern recognition can result in an unambiguous and correct identification despite the proximity of other similar structures in the vicinity. Pattern recognition includes evaluation of contrast, density, tone, and grey scale in an image.

The test structure 250 includes a first set 245 of features and a second set 255 of features. The first set 245 of features is a subset of the product features to be monitored. The second set 255 of features is similar to the first set 245 of features, but differs in one or more ways. The second set 255 of features may be merged directly into the first set 245 of features or may be separated by a buffer region 265. Pattern recognition may be performed on part or all of the first set 245 of features and part or all of the second set 255 of features. Alternatively, pattern recognition may be done only on part or all of the second set 255 of features.

Uniqueness is provided to the test structure 250 by the second set 255 of features. The uniqueness may involve one or more characteristics such as size, linewidth, space, pitch, orientation, pattern factor, polarity, number of edges, and number of features.

Size refers to the dimensions of a set of features, such as the length and the width of an array of holes. Linewidth refers to the shortest linear distance between the facing edges of a feature, such as the diameter of a hole or the width of a line. Space refers to the shortest linear distance between the facing edges of adjacent features. Pitch refers to the sum of a linewidth and an adjacent space in a regularly repeating pattern of identical features. Orientation refers to the angular placement of a feature in the die.

Pattern factor refers to the percentage of total area (features and spaces) that is occupied by the interior of the features. Polarity refers to placement of the interior of a feature on one side of an edge versus the other side of the edge. Polarity is reversed by exchanging the interior of a feature with the exterior of a feature. Polarity affects the perceived grey scale in an image.

Number of edges refers to number of intersections where two predominantly distinct surfaces meet. An edge defines a boundary, usually quite abrupt, between the interior of a feature and the exterior of a feature.

The second set 255 of features in the present invention should be as small and unobtrusive as possible in order to avoid taking up too much space. In general, the second set 255 of features occupies a smaller area than the first set 245 of features. Furthermore, the second set 255 of features should not be vastly different in shape and dimension from the first set 245 of features so as to avoid violating groundrules for design and layout of the product.

Figure 4A:
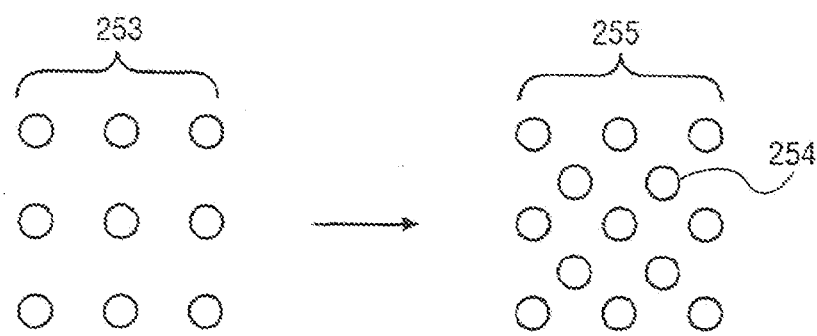
FIGS. 4(a)–(c) are illustrations of modifications or transformations to provide sufficient uniqueness to a set of features.

The second set 255 of features is created by modifying a template 253. The template 253 is based on the first set 245 of features. The modification usually involves geometric transformation of the features. For example, if the template 253 includes product features such as holes arranged in a square array, the second set 255 of features may include additional holes 254 so the array becomes face-centered. See FIG. 4(a).

Figure 4B:
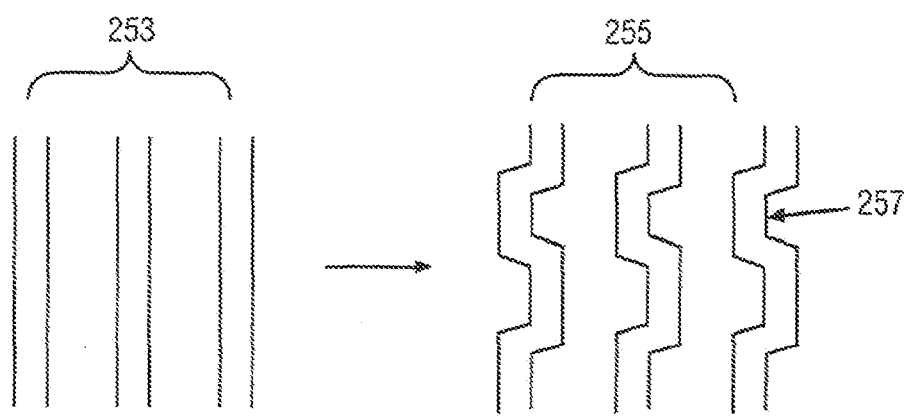

If the template 253 includes parallel lines, the second set 255 of features may have jogs 257 in the lines. See FIG. 4(b).

Figure 4C:
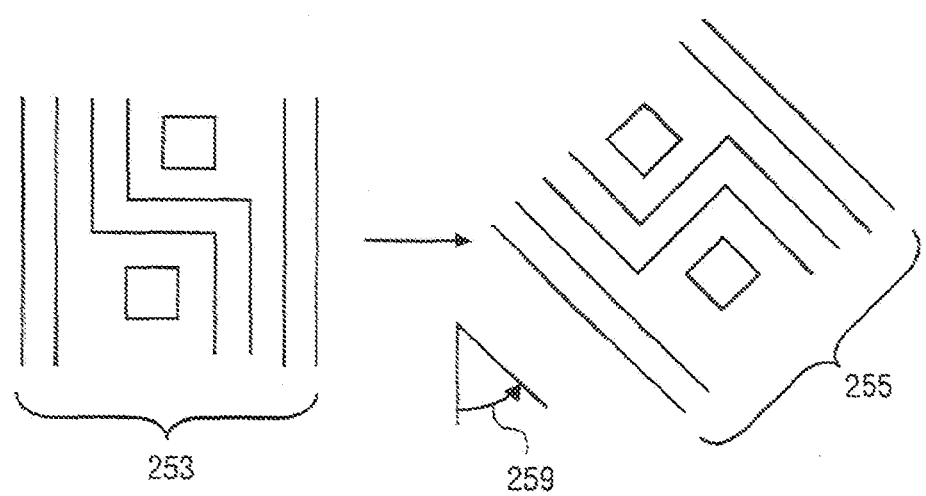

If the template 253 has features that are predominantly rectilinear in the x- and y-directions, the modification can introduce a rotation 259 to form the second set 255 of features. See FIG. 4(c).

Another embodiment of the present invention involves a method of designing a test structure with sufficient uniqueness to facilitate successful pattern recognition of its image. The test structure has a first set of features and a second set of features. The second set of features serves to provide sufficient uniqueness to facilitate pattern recognition of the test structure. In general, similar test structures that are located near each other may be distinguished by modifying their second set of features.

Figure 5:
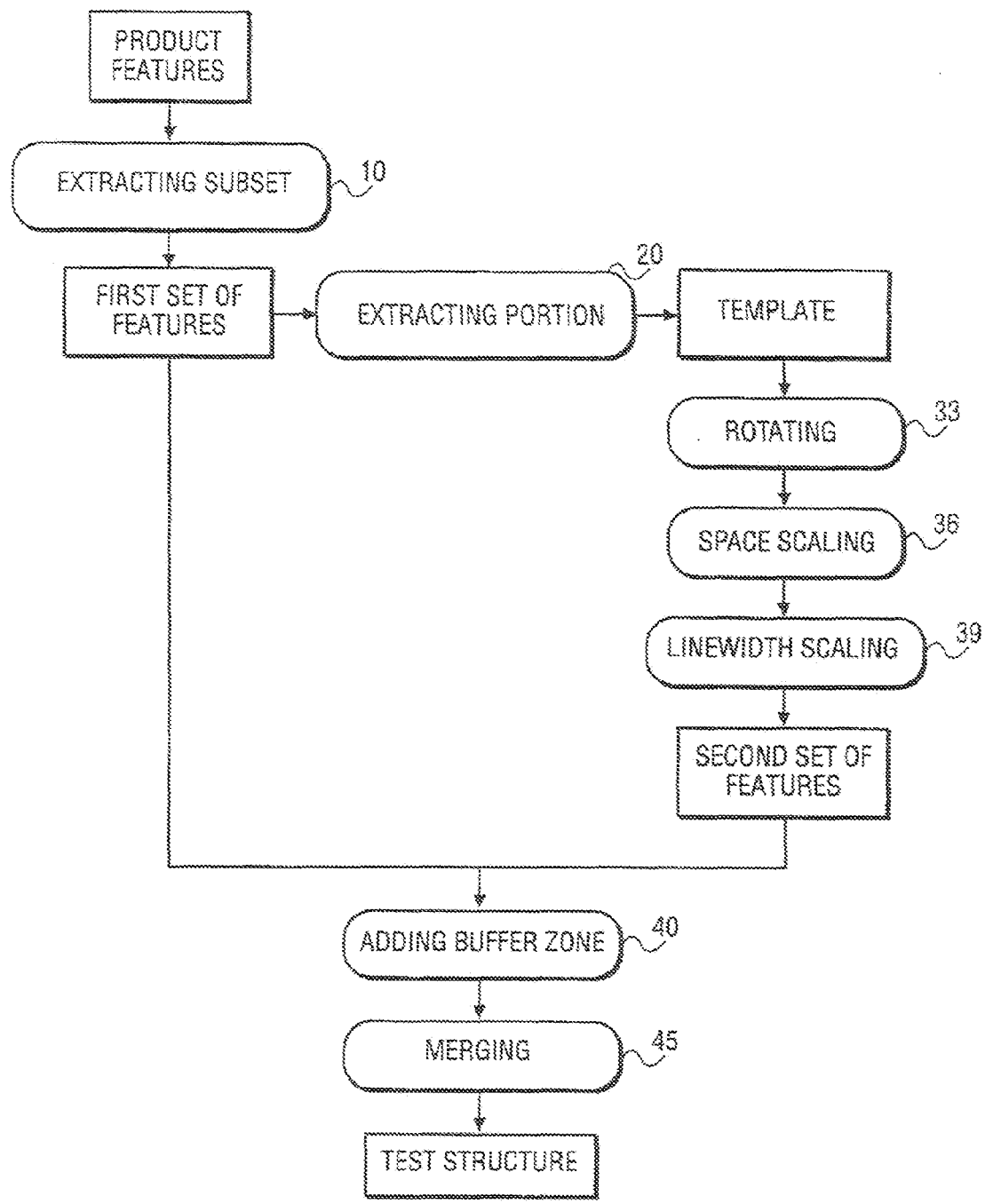
FIG. 5 is a flowchart of a typical geometric transformation.

A flowchart of a typical geometric transformation according to the present invention is shown in FIG. 5. Depending on the situation, the individual operations described below may be performed in a different sequence. As needed, some operations may also be performed iteratively. If desired, the claimed invention may be automated, in whole or in part, using software and a computer.

First, as shown in block 10, a subset is extracted from the product features to form a first set of features.

Second, as shown in block 20, a portion is extracted from the first set of features to form a template. A portion may represent 3 to 15 percent of the first set of features.

Third, the template is transformed into a second set of features by three operations: rotating, space scaling, and linewidth scaling.

As shown in block 33, the template is rotated in either a counterclockwise or a clockwise direction. The rotation is typically in the range of 15 to 55 degrees, but may be as small as 0 or as large as 90 degrees. A negative rotation is counterclockwise while a positive rotation is clockwise.

As shown in block 36, the spaces between the features in the template are changed by a space scaling factor. The space scaling factor is typically in the range of −0.85 to +2.00. A negative space scaling factor reduces a space while a positive space scaling factor increases a space.

As shown in block 39, the linewidths of the features in the template are changed by a linewidth scaling factor. The linewidth scaling factor is typically in the range +0.25 to −0.25. A positive linewidth scaling factor enlarges a feature while a negative linewidth scaling factor shrinks a feature. The linewidth scaling factor and the space scaling factor usually have opposite algebraic signs.

Fourth, as shown in block 40, a buffer zone is added. A buffer zone essentially represents a lateral displacement. The buffer zone may simplify design and layout since different first sets and different second sets may be combined as desired.

Fifth, as shown in block 45, the first set of features and the second set of features are merged to form a test structure.

Accuracy of pattern recognition may be reduced if the pattern factor is too low. Sensitivity of pattern recognition is also affected by local variation in pattern factor across a test structure. The average change in pattern factor of the test structure after scaling both the space and the linewidth should be kept in the range −0.15 to +0.15. This can be achieved because the area occupied by the first set 245 of features is usually much larger than the area occupied by the second set 255 of features. It is desirable not to change pattern factor too drastically in the test structure because the fabrication process is normally optimized for a particular pattern factor in the product A further embodiment of the present invention involves a method of performing pattern recognition of a test structure that has been designed with sufficient uniqueness as described above. The method is to store an image of a reference structure with the appropriate uniqueness, load a sample on a stage, move the stage to go to a nominal location on the sample based on an external reference coordinate system, adjust the stage to the appropriate orientation, adjust the optical column to the appropriate magnification, focus and fine-tune an image of a test structure, capture the test image in a field of view, store the test image in a buffer, scan all portions of a specified region of interest (ROI) of the test image, recall the reference image, perform a normalized correlation of each portion relative to the reference image, compute a score for the degree of similarity of each portion to the reference image, discard the portions with scores below the allowable threshold, rank the portions from highest score to lowest score, determine the location of the portion with the highest score, compare with the nominal location, calculate offsets and scaling factors, move the stage to a measurement location within the field of view, change magnification, focus and fine-tune an image of a measurement structure, capture the measurement image in the field of view, store the measurement image in a buffer, acquire a signal profile of the measurement image, and use an edge detection algorithm to measure CD. The CD may be determined using algorithms employing techniques such as linear regression (of the base line and the slope line), peak-to-peak, and threshold.

In general, the score depends on the degree of match between the reference image and the test image. In other words, the score depends on the first set of features and the second set of features which form the test structure. Normalized correlation is used to determine the score because it is not susceptible to linear changes in brightness of the captured image. However, normalized correlation can be affected by nonlinear changes, such as charging of a sample.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

We claim:

1. A method comprising:
   extracting a subset from product features to form a first set of features;
   extracting a small portion from said first set of features to form a template;
   transforming said template into a second set of features by
   rotating said template;
   scaling spaces between features in said template;
   scaling linewidths of features in said template;
   merging said first set and said second set of features to form a test structure, wherein similar test structures that are located near each other may be distinguished by modifying their second features.

2. A method comprising:
   extracting a subset from product features to form a first set of features;
   extracting a small portion from said first set of features to form a template wherein said small portion may represent 3 to 15 percent of said first set of features;
   transforming said template into a second set of features by
   rotating said template;
   scaling spaces between features in said template;
   scaling linewidths of features in said template;

merging said first set and said second set of features to form a test structure.

3. A method comprising:

extracting a subset from product features to form a first set of features;

extracting a small portion from said first set of features to form a template;

transforming said template into a second set of features by
  rotating said template wherein said rotating of said template is typically in a range of 15 to 55 degrees;
  scaling spaces between features in said template;
  scaling linewidths of features in said template;

merging said first set and said second set of features to form a test structure.

4. A method comprising:

extracting a subset from product features to form a first set of features;

extracting a small portion from said first set of features to form a template;

transforming said template into a second set of features by
  rotating said template;
  scaling spaces between features in said template wherein said scaling of said spaces between said features in said template is typically in a range of −0.85 to +2.00;
  scaling linewidths of features in said template;

merging said first set and said second set of features to form a test structure.

5. A method comprising:

extracting a subset from product features to form a first set of features;

extracting a small portion from said first set of features to form a template;

transforming said template into a second set of features by
  rotating said template;
  scaling spaces between features in said template;
  scaling linewidths of features in said template wherein said scaling of said linewidths of said features in said template is typically in a range of +0.25 to −0.25;

merging said first set and said second set of features to form a test structure.

6. A method comprising:

extracting a subset from product features to form a first set of features;

extracting a small portion from said first set of features to form a template;

transforming said template into a second set of features by
  rotating said template;
  scaling spaces between features in said template;
  scaling linewidths of features in said template;

merging said first set and said second set of features to form a test structure wherein a buffer zone is added before said merging of said first set and said second set of features to form said test structure.

7. The method of claim 6 wherein said buffer zone essentially represents a lateral displacement.

8. A method comprising:

extracting a subset from product features to form a first set of features;

extracting a small portion from said first set of features to form a template;

transforming said template into a second set of features by
  rotating said template;
  scaling spaces between features in said template;
  scaling linewidths of features in said template;

merging said first set and said second set of features to form a test structure wherein an average change in pattern factor of said test structure after said scaling of both said spaces and said linewidths should be kept in a range of −0.15 to +0.15.

* * * * *